US012269063B2

(12) United States Patent
Hughes et al.

(10) Patent No.: US 12,269,063 B2
(45) Date of Patent: Apr. 8, 2025

(54) ULTRASOUND ARRAY TRANSDUCER MANUFACTURING

(71) Applicant: Novosound Ltd., Newhouse (GB)

(72) Inventors: David Hughes, Newhouse (GB); Daniel Irving, Newhouse (GB)

(73) Assignee: Novosound Ltd., Newhouse (GB)

( * ) Notice: Subject to any disclaimer, the term of this patent is extended or adjusted under 35 U.S.C. 154(b) by 1254 days.

(21) Appl. No.: 16/976,685

(22) PCT Filed: Feb. 28, 2019

(86) PCT No.: PCT/GB2019/050567
§ 371 (c)(1),
(2) Date: Aug. 28, 2020

(87) PCT Pub. No.: WO2019/166815
PCT Pub. Date: Sep. 6, 2019

(65) Prior Publication Data
US 2020/0406299 A1 Dec. 31, 2020

(30) Foreign Application Priority Data

Mar. 2, 2018 (GB) ...................... 1803444

(51) Int. Cl.
*H10N 30/05* (2023.01)
*B06B 1/06* (2006.01)
(Continued)

(52) U.S. Cl.
CPC ............ *B06B 1/085* (2013.01); *B06B 1/0625* (2013.01); *H10N 30/05* (2023.02); *H10N 30/06* (2023.02);
(Continued)

(58) Field of Classification Search
CPC ........ H10N 30/06; H10N 30/87; H10N 30/05; H10N 30/875; Y10T 29/42; B06B 1/085; B06B 1/0625; B33Y 10/00
See application file for complete search history.

(56) References Cited

U.S. PATENT DOCUMENTS 6,256,849 B1     7/2001  Kim
7,629,728 B1 *  12/2009  Pletner ................. H10N 30/875
                                                          310/366

(Continued)

FOREIGN PATENT DOCUMENTS

CN      101354231 A     1/2009
CN      103601147 A     2/2014
(Continued)

OTHER PUBLICATIONS

Shen et al., "Design and Fabrication of a multi-degree-of-freedom Microactuator using symmetric piezoelectric pusher element and its applications," 2012 IEEE/SICE International Symposium on System Integration (SII), Fukuoka, Japan, 2012, pp. 686-691. (Year: 2012).*

(Continued)

*Primary Examiner* — A. Dexter Tugbang
(74) *Attorney, Agent, or Firm* — Patterson + Sheridan, LLP

(57) ABSTRACT

There is provided a method for manufacturing, or for use in manufacturing a flexible ultrasonic transducer array and the resultant ultrasonic transducer array. The method includes providing a layer of piezoelectric material onto a foil substrate and using additive techniques to apply a plurality of electrodes to a surface of the piezoelectric material such that the electrodes are arranged in an electrode array and to apply a plurality of electrical conduction tracks and a plurality of electrical connectors to the surface of the piezoelectric material or to a layer of dielectric material provided on the (Continued)

surface of the piezoelectric material, such that respective electrical conduction tracks electrically connect a respective electrode to a respective electrical connector. The additive techniques comprise at least one of: masking, deposition, photo patterning, printing or patterned coating.

9 Claims, 8 Drawing Sheets

(51) Int. Cl.
    *B06B 1/08*     (2006.01)
    *H10N 30/06*     (2023.01)
    *H10N 30/87*     (2023.01)
    *B33Y 10/00*     (2015.01)

(52) U.S. Cl.
    CPC ............ *H10N 30/875* (2023.02); *B33Y 10/00* (2014.12); *H10N 30/87* (2023.02); *Y10T 29/42* (2015.01)

(56) References Cited

U.S. PATENT DOCUMENTS

| | | | |
|---|---|---|---|
| 2001/0042291 A1 | 11/2001 | Esashi et al. | |
| 2004/0178698 A1 | 9/2004 | Shimoe et al. | |
| 2008/0122318 A1 | 5/2008 | Alkawa et al. | |
| 2009/0171216 A1 | 7/2009 | Sadaka | |
| 2010/0325855 A1 | 12/2010 | Sadaka et al. | |
| 2010/0328242 A1 | 12/2010 | Paleczny et al. | |
| 2014/0292157 A1* | 10/2014 | Takemura | H10N 30/87 310/365 |
| 2015/0367586 A1 | 12/2015 | Georgeson et al. | |
| 2017/0252777 A1 | 9/2017 | Kidwell, Jr. et al. | |

FOREIGN PATENT DOCUMENTS

| | | | |
|---|---|---|---|
| CN | 104921758 A | 9/2015 | |
| CN | 107470116 A | 12/2017 | |
| DE | 102014221495 A1 | 4/2016 | |
| GB | 2571529 A | 9/2019 | |
| JP | 2004118754 A * | 4/2004 | ............ G06F 3/041 |
| WO | 2019166805 A2 | 9/2019 | |

OTHER PUBLICATIONS

Examination Report from GB 1803444.7 dated Jan. 8, 2019.
Search Report from GB 1803444.7 dated Aug. 10, 2018.
Examination Report from GB 1803444.7 dated Dec. 18, 2019.
Examination Report from EP 19 716 473.4 dated Mar. 20, 2023.
International Search Report and Written Opinion dated Jul. 22, 2019 for International Application No. PCT/GB2019/050567.
Chinese Application No. 201980029871.7 Chinese Office Action dated Jun. 16, 2021, with Statement of Relevance, 10 pages.

* cited by examiner

ULTRASOUND ARRAY TRANSDUCER MANUFACTURING

FIELD

The present disclosure relates to ultrasonic transducers and the manufacturing thereof, particularly though not exclusively, to ultrasonic transducer arrays.

BACKGROUND

Ultrasound spans the range of sound frequencies that are higher than the range that can be heard by humans, and generally have frequencies of greater than 20 kHz. Typical ranges of operation extend from 20 kHz up to 200 MHz. The required frequency range of operation may vary depending on the intended application. For example, for non-destructive testing, frequencies in the range from 100 kHz to 20 MHz may be preferred, for medical imaging, frequencies in the range from 1 to 100 MHz may be preferred and in dental imaging frequencies in the frequency range from 20 to 200 MHz may be preferred. However, the above are only exemplary, and different operating ultrasound frequencies may be required depending on the specific application. Due to the much higher frequencies involved, ultrasonic devices are typically very different from those generally used for audible applications.

Analysis using ultrasound waves shows great promise in a range of applications, particularly in imaging such as medical imaging but also in fields such as non-destructive testing (NDT), particularly in industrial NDT. Dental imaging using ultrasonic techniques is one example of a suitable application, wherein the ultrasound imaging can be used to determine properties of the layers of the tooth. However, ultrasound has a wide range of uses and the applications of ultrasound are not limited to these examples.

The ultrasound transducer is operable to produce ultrasonic waves that are transmitted into the sample and detect reflections of the ultrasonic waves that are reflected from the interfaces between the layers of the sample. By using techniques such as time of flight and other analyses, it is possible to image the layers of the sample and thereby characterise the sample.

Conventional ultrasonic transducers are generally formed from bulk ceramic materials, which can be high cost, bulky and difficult to manufacture, particularly with the shapes and properties desired for many applications. Furthermore, traditional ultrasound transducers are not easy to manufacture using automated techniques and often require a high degree of manual operation. Improved ultrasonic transducers and methods for manufacturing them are therefore desirable.

SUMMARY

Various aspects of the present invention are defined in the independent claims. Some preferred features are defined in the dependent claims.

According to a first aspect of the present disclosure is a method for manufacturing, or for use in manufacturing, an ultrasonic transducer, the method comprising:
 providing a layer of piezoelectric material;
 using one or more additive techniques to apply at least one electrode to a surface of the piezoelectric material and/or to form at least one electrical conduction track and/or at least one electrical connector, e.g. on the surface of the piezoelectric material or on a layer of dielectric material provided thereon.

The electrode(s), electrical conduction track(s) and electrical connector(s) may all be fully printed or otherwise formed using one or more additive techniques. In examples, at least the electrode(s), electrical conduction track(s) and/or electrical connector(s) may be integrally formed, e.g. on the layer of piezoelectric material and/or the layer of dielectric material provided thereon, using the one or more additive techniques. The layer of dielectric material may be an intervening layer. In this way it may not be necessary to form separate electrodes, conduction tracks and/or electrical connectors. The above arrangement facilitates full flexibility (e.g. bendiness) of the ultrasound transducer and easy customization for a full range of applications. The present method may comprise the electrodes being connected to the contacts by electrical conduction tracks formed using the additive techniques. This may allow a reflow solder method to be used to attach a standard electrical connection to the contact without traditional wiring or hand-wiring to a cable or interface. This may simplify the production process and may provide a more robust flexible transducer.

The layer of piezoelectric material may be disposed on a substrate.

The method may comprise using the additive techniques to provide a plurality of the electrodes, e.g. an electrode array. The electrodes of the electrode array may be distributed over one or two dimensions. In one example, the electrodes of the electrode array may be linearly distributed. However, the array of electrodes need not be linearly distributed and may be distributed in two dimensions, e.g. such as (but not limited to) a grid, a circle, annularly, concentric or nested electrodes, electrodes depending off connectors arranged in tree configurations, or another arrangement. By using the method described herein, more degrees of freedom in producing electrode arrays with varying arrangements or patterns of electrodes, different electrode sizes, differing numbers of electrodes and different electrode shapes may be realized. In this way, the positioning of the electrodes in the electrode array, the size of the electrodes provided at different locations, the number of electrodes and the shape of the electrodes can be easily selected to produce a desired focus or shape of the ultrasonic beam produced by the transducer array. For example, the electrodes may be rectangular, square, circular, oval or annular, a polygon, and/or other shapes.

The at least one electrode may be, comprise or be comprised in at least one working electrode.

Respective electrical conduction tracks may electrically connect a respective electrode to a respective electrical connector. In this way, each electrode of the electrode array may be individually addressable.

The additive techniques may comprise masking and/or photo-patterning. The method may comprise applying a resist material, e.g. to the surface of the layer of piezoelectric material. The method may comprise applying a layer of the resist material, e.g. over at least part or the entire surface of the layer of piezoelectric material. The resist material may be or comprise a photo resist. The resist material may be or comprise an epoxy material such as SU-8. The resist material may be activatable or reactable by radiation, e.g. by optical light, UV, extreme UV (EUV) and/or the like.

The method may comprise providing a mask. The mask may define a pattern of openings. The shape of the mask and/or the pattern of openings may reflect or image the shape of the electrodes, the conduction tracks and/or the connectors. The method may comprise applying the radiation to the resist material via the mask, e.g. so that only selected areas of the resist material receive the radiation, as governed by the mask, e.g. by the shape and/or the pattern of openings thereof. The radiation may selectively crosslink or otherwise modify or react the selected areas of the resist material that receive the radiation. The method may comprise removing parts of the layer of resist material, e.g. removing the parts of the layer of resist material other than the selected areas that have been exposed to the radiation (if the resist material is a negative photoresist) or by removing the selected areas of the layer of resist material that have been exposed to the radiation (if the resist material is a positive photoresist). The removal of the parts of the layer of resist material may be carried out using a suitable solvent, e.g. water, an organic solvent, a polar solvent, and/or the like.

The remaining resist material after the parts of the resist material have been removed may define a series of apertures or openings through the resist material, e.g. so as to expose the piezoelectric material through the openings or apertures. At least some of the apertures or openings may define the location of the at least one electrode (e.g. the electrodes of the electrode array). At least some of the apertures of openings may define the location of the at least one electrical conduction track and/or the at least one electrical connector. At least some or all of the openings or apertures (e.g. the apertures or openings defining the location of the at least one electrode) may be elongate and may be between 0.1 and 10 mm long and between 0.01 and 1 mm wide, e.g. between 0.5 and 5 mm long and between 0.05 and 0.5 mm wide, such as 1 mm×0.1 mm. The width of the electrode may correspond to, e.g. may be within 20% either side of, $\lambda/2$, where $\lambda$ is an operating wavelength of the ultrasonic waves produced by the transducer. A kerf of resist material may remain between at least some or all of the apertures or openings, e.g. between the apertures or openings defining the location of the at least one electrode. The kerf may be between 0.01 and 0.1 mm, e.g. 0.05 mm wide. The dimensions indicated above may be particularly beneficial for high frequency applications. However, it is very difficult to produce ultrasonic transducer arrays having these dimensions using traditional techniques, at least with sufficient quality and reproducibility.

The method may comprise applying a conductive material at least to the apertures or openings in the layer of resist material and/or the parts of the piezoelectric material that are not covered by resist material. The conductive material may be or comprise a metal or metallic material such as gold. The conductive material may be applied using a masked deposition. The conductive material may be applied such that it is selectively deposited only onto at least some or all of the portions of the piezoelectric material corresponding to the parts of the piezoelectric material corresponding to the openings or apertures and/or other parts of the piezoelectric material that are not covered by the resist material. The conductive material may be in direct contact with, and may be fixed to, at least some or all of the portions of the piezoelectric material corresponding to the openings or apertures and/or other parts of the piezoelectric material that are not covered by the resist material.

The method may comprise removing the remaining resist material or the remaining resist material (e.g. around the electrodes, the tracks and/or the connectors) may be left in place. The conductive material may form the at least one electrode (e.g. the electrodes of the electrode array), the at least one electrical conduction track and/or the at least one electrical connector. Respective electrodes may be integral with their corresponding track and connector. Two or more of: the electrodes, the conduction tracks and/or the electrical connectors may be partially or wholly formed in the same manufacturing step or by the same process, e.g. during a common application or deposition step.

The additive technique may comprise printing, patterned coating, 3D printing and/or the like. For example, one or more of: the at least one electrode (e.g. the electrodes of the electrode array), the at least one electrical conduction tracks and/or the at least one electrical connector may be directly printed, e.g. onto the piezoelectric material. The additive technique may comprise other suitable additive or selective deposition techniques that would be apparent to one skilled in the art from the teaching of the present application.

The at least one electrode (e.g. the electrodes of the electrode array) may be elongate, e.g. rectangular. The at least one electrode (e.g. the electrodes of the electrode array) may be dimensioned in the order of mm. For example, the at least one electrode (e.g. the electrodes of the electrode array) may be between 0.1 and 10 mm long and between 0.01 and 1 mm wide, e.g. between 0.5 and 5 mm long and between 0.05 and 0.5 mm wide, such as 1 mm×0.1 mm. The at least one electrode (e.g. the electrodes of the electrode array) may be spaced from each other, e.g. by between 0.01 and 0.1 mm, e.g. by 0.05 mm.

Each electrode in the electrode array may be connected to a corresponding connector by a corresponding electrical conduction track. At least part of at least one or more or each of the at least one electrical conduction tracks may extend away from, spread or fan out from at least one or more or each other electrical conduction track. The separation between the electrical connectors may be greater than the separation between the electrodes of the electrode array. For example, the pitch of the electrical connectors may be from 0.1 mm to 2.54 mm, e.g. 0.5 mm. This arrangement may allow a higher or finer resolution in the electrode array but still allow the electrical connectors to be arranged in a standard connector pitch.

The electrode array may comprise from 8 to 256 electrodes, e.g. from 16 to 128 electrodes such as from 16 to 64 electrodes. The electrode array may comprise a plurality of different sizes of electrodes, e.g. having different electrode areas. The electrode array may comprise electrodes of different shapes. In this way, by suitable selection of electrode area and shape, it may allow the focus of the beam to be controlled without use of multiple channels.

The substrate may be electrically conductive, i.e. it may be an electrical conductor. The substrate may be planar. The substrate may be a film or sheet. The substrate may be metallic, e.g. a metal film. The substrate may be or comprise a metal or metallic foil such as aluminium foil.

The substrate may be, comprise, or be comprised in an electrical ground electrode. The substrate may be, comprise, or be comprised in a counter electrode to the electrode formed by the additive techniques. The counter electrode may form an electrode pair with the at least one working electrode (e.g. the working electrodes of the electrode array), which may be provided on an opposing side of the piezoelectric material to the counter electrode. The substrate may be, comprise, or be comprised in a ground electrode. A surface of the substrate that is opposite to a surface of the substrate upon which the layer of piezoelectric material is disposed may be a radiating surface from which ultrasonic waves are radiated in use.

The substrate may be or comprise a thin film. The substrate may have a thickness in the range of 20 to 200 μm. The substrate may be thicker than the layer of piezoelectric material, e.g. by at least a factor of 6 or by a factor of 10 or more.

The layer of piezoelectric material may be, comprise or be comprised in a film of piezoelectric material. The layer of piezoelectric material may be configured and/or operable to produce ultrasound, i.e. the layer of piezoelectric material may be or comprise an ultrasound production layer. The piezoelectric material may be or comprise an inorganic material. The piezoelectric material may be a crystalline, e.g. polycrystalline, piezoelectric material. The piezoelectric material may be a non-polymeric piezoelectric material. The piezoelectric material may be or comprise a metal oxide, such as zinc oxide. The piezoelectric material may be or comprise a metal nitride, such as aluminium nitride. The piezoelectric material may be or comprise a continuous layer of material having piezoelectric properties, e.g. the piezoelectric material may not comprise discrete domains of piezoelectric material having piezoelectric properties within a matrix of non-piezoelectric material. The layer of piezoelectric material may have a thickness in the range of 2 to 20 μm. The layer of piezoelectric material may be thinner than the substrate. The above materials are additionally beneficial as they can withstand the temperatures that arise during re-flow soldering, which may allow production using more beneficial manufacturing techniques.

The layer of piezoelectric material or the piezoelectric material itself may be or comprise a non-ferroelectric material. The layer of piezoelectric material or the piezoelectric material itself may provide both a piezoelectric and pyroelectric response. This arrangement may allow dual use as an ultrasound array and a temperature sensor, e.g. for calibration of the ultrasound measurement.

The method may comprise providing an encapsulating material, e.g. on, around and/or between at least part or all of the electrical conduction tracks and/or the at least one electrode (e.g. the electrodes of the array of electrodes). The encapsulation material may be or comprise an electrically insulating material. The encapsulation material may be or comprise a dielectric material. The encapsulating material may leave at least part or all of the connectors exposed, i.e. without encapsulating material. The encapsulating material may leave at least the radiating surface of the substrate exposed, i.e. without encapsulating material. The encapsulating material may cover the electrical conduction tracks and/or the at least one electrode (e.g. the electrodes of the array of electrodes). The encapsulation material may be provided only on the piezoelectric material and/or the electrically conducting material that forms the electrical conduction tracks and/or the at least one electrode, i.e. not on the substrate or at least not on the side of the substrate that is opposite the side of the substrate upon which the piezoelectric material is provided.

The ultrasonic transducer or ultrasonic transducer array may be flexible. The substrate, the layer of piezoelectric material and the at least one electrode, at least one electrical conduction track and/or at least one electrical connector may be flexible.

The ultrasonic transducer or ultrasonic transducer array may be configured to produce ultrasound in the frequency range of between 20 kHz to 200 MHz.

Certain embodiments of the above described method and resulting transducer or transducer array provide potential advantages. The cost of production may be lowered. Production of electrode arrays may be simplified, and/or throughput and/or quality increased. The above method may be more suited to high volume or automated manufacture and/or may reduce the level of manual intervention required. The resolution of the resulting ultrasonic device may be high whilst still allowing connection to standard connectors. The ultrasonic transducer or transducer array may be capable of high frequency operation. The ultrasonic transducer or transducer array may be flexible, which may allow the designer more degrees of freedom and/or easier configuration of the ultrasonic transducer or transducer array. The method means that complex individual wire bonding to connect electrodes may not be required. The resulting ultrasonic transducer or transducer array may have all of the electrical connections on one surface, which may be a back surface or surface other than the emission surface from which the ultrasonic radiation is emitted. This may result in an easier to assemble ultrasonic transducer or transducer array. Furthermore, the ultrasonic transducer or transducer array may be assembled without folding, e.g. without folding of the substrate, piezoelectric material and/or the tracks or electrodes. This may reduce the failure/defect rate. The potential advantages are not limited to the above.

According to a second aspect of the present disclosure is an ultrasonic transducer or ultrasonic transducer array comprising:
  a layer of piezoelectric material;
  at least one electrode disposed on a surface of the piezoelectric material.

The ultrasonic transducer or ultrasonic transducer array may be formed using the method of the first aspect.

The ultrasonic transducer array may comprise a plurality of electrodes, e.g. an electrode array. The electrodes of the electrode array may be distributed over one or two dimensions.

In one example, the electrodes of the electrode array are linearly distributed. The electrodes may be working electrodes. The electrodes may be distributed in a circle or circular arrangement or around in an annular arrangement.

The ultrasonic transducer array may comprise at least one electrical conduction track and at least one electrical connector. Respective electrical conduction tracks may electrically connect a respective electrode to a respective electrical connector. Each electrode of the electrode array may be individually addressable, e.g. via a corresponding connector and track.

The at least one electrode (e.g. the electrodes of the electrode array) may be elongate, e.g. rectangular. The at least one electrode (e.g. the electrodes of the electrode array) may be dimensioned in the order of mm. For example, the at least one or each electrode (e.g. the electrodes of the electrode array) may be between 0.1 and 10 mm long and between 0.01 and 1 mm wide, e.g. between 0.5 and 5 mm long and between 0.05 and 0.5 mm wide, such as 1 mm×0.1 mm. The at least one electrode (e.g. the electrodes of the electrode array) may be spaced from each other, e.g. by between 0.01 and 0.1 mm, e.g. by 0.05 mm.

At least part of at least one or more or each of the at least one electrical conduction tracks may extend away from, spread or fan out from at least one or more or each other electrical conduction track. The separation between the electrical connectors may be greater than the separation between the electrodes of the electrode array. For example, the pitch of the electrical connectors may be from 0.1 mm to 1 mm, e.g. 0.5 mm.

The electrode array may comprise from 8 to 256 electrodes, e.g. from 16 to 128 electrodes.

The substrate may be electrically conductive, i.e. it may be an electrical conductor. The substrate may be planar. The substrate may be a film or sheet. The substrate may be metallic, e.g. a metal film. The substrate may be or comprise a metal or metallic foil such as aluminium foil.

The substrate may be, comprise, or be comprised in an electrical ground electrode. The substrate may be, comprise, or be comprised in a counter electrode to the electrode formed by the additive techniques. The counter electrode may form an electrode pair with the at least one working electrode (e.g. the working electrodes of the electrode array), which may be provided on an opposing side of the piezoelectric material to the counter electrode. A surface of the substrate that is opposite to a surface of the substrate upon which the layer of piezoelectric material is disposed may be a radiating surface from which ultrasonic waves are radiated in use.

The substrate may be or comprise a thin film. The substrate may have a thickness in the range of 20 to 200 μm. The substrate may be thicker than the layer of piezoelectric material.

The layer of piezoelectric material may be, comprise or be comprised in a film of piezoelectric material. The layer of piezoelectric material may be configured and/or operable to produce ultrasound, i.e. the layer of piezoelectric material may be or comprise an ultrasound production layer. The layer of piezoelectric material may be or comprise a layer of inorganic piezoelectric material. The layer of piezoelectric material may be or comprise a layer of crystalline, e.g. polycrystalline, piezoelectric material. The layer of piezoelectric material may be non-polymeric and/or may be or comprise a layer of non-polymeric piezoelectric material. The piezoelectric material may be or comprise a metal oxide, such as zinc oxide. The piezoelectric material may be or comprise a metal nitride, such as aluminium nitride. The piezoelectric material may be or comprise a continuous layer of material having piezoelectric properties, e.g. the piezoelectric material may not comprise discrete domains of piezoelectric material having piezoelectric properties within a matrix of non-piezoelectric material. The layer of piezoelectric material may have a thickness in the range of 2 to 20 μm. The layer of piezoelectric material may be thinner than the substrate. The layer of piezoelectric material or the piezoelectric material itself may be or comprise a non-ferroelectric material. The layer of piezoelectric material or the piezoelectric material itself may provide both a piezoelectric and pyroelectric response.

The ultrasonic transducer or transducer array may comprise an encapsulating material, e.g. on, around and/or between at least part or all of the electrical conduction tracks and/or the at least one electrode (e.g. the electrodes of the array of electrodes). The encapsulation material may be or comprise an electrically insulating material. The encapsulating material may leave at least part or all of the connectors exposed. The encapsulating material may cover the electrical conduction tracks and/or the at least one electrode (e.g. the electrodes of the array of electrodes). The encapsulation material may be provided only on the piezoelectric material and/or the electrically conducting material that forms the electrical conduction tracks and/or the at least one electrode, i.e. not on the substrate or at least not on the side of the substrate that is opposite the side of the substrate upon which the piezoelectric material is provided.

The ultrasonic transducer may be flexible. The substrate, the layer of piezoelectric material and the at least one electrode, at least one electrical conduction track and/or at least one electrical connector may be flexible.

According to a third aspect of the present disclosure is a set of computer readable instructions or computer code configured such that, when processed by additive manufacturing equipment, permit, control or cause the additive manufacturing equipment, or provide instructions or data for the additive manufacturing equipment, to produce at least part of the ultrasonic transducer or ultrasonic transducer array of the second aspect or to perform at least some of the steps of the method of the first aspect.

The additive manufacturing equipment may be, comprise or be comprised in a 3D printer, other type of printer, coater and/or the like. The additive manufacturing equipment may be computer controlled or controllable.

The set of computer readable instructions or computer code may be configured such that, when processed by additive manufacturing equipment, permit, control, cause or provide instructions or data for the additive manufacturing equipment to deposit the at least one electrode (e.g. the electrodes of the electrode array), the electrical conductor tracks and/or the electrical connectors of the ultrasonic transducer or ultrasonic transducer array of the second aspect or that are provided as part of the method of the first aspect.

According to a fourth aspect of the present disclosure is an ultrasonic device configured to produce and emit ultrasonic waves, the ultrasonic device comprising the ultrasonic transducer or ultrasonic transducer array of the second aspect.

The ultrasonic device may be configured to receive reflections of the emitted ultrasonic waves.

The ultrasonic device may be a medical ultrasound imager. The ultrasonic device may be a non-destructive testing device. The ultrasonic device may be a dental ultrasound imager for imaging the structure or teeth.

The individual features and/or combinations of features defined above in accordance with any aspect of the present invention or below in relation to any specific embodiment of the invention may be utilised, either separately and individually, alone or in combination with any other defined feature, in any other aspect or embodiment of the invention.

Furthermore, the present invention is intended to cover apparatus configured to perform any feature described herein in relation to a method and/or a method of using, producing or manufacturing any apparatus feature described herein. For any of the apparatus features described above as performing a function, the present invention also covers a method comprising performing that function.

BRIEF DESCRIPTION OF THE DRAWINGS

These and other aspects of the present disclosure will now be described, by way of example only, with reference to the accompanying Figures, in which.

DETAILED DESCRIPTION OF THE DRAWINGS

Figure 1:
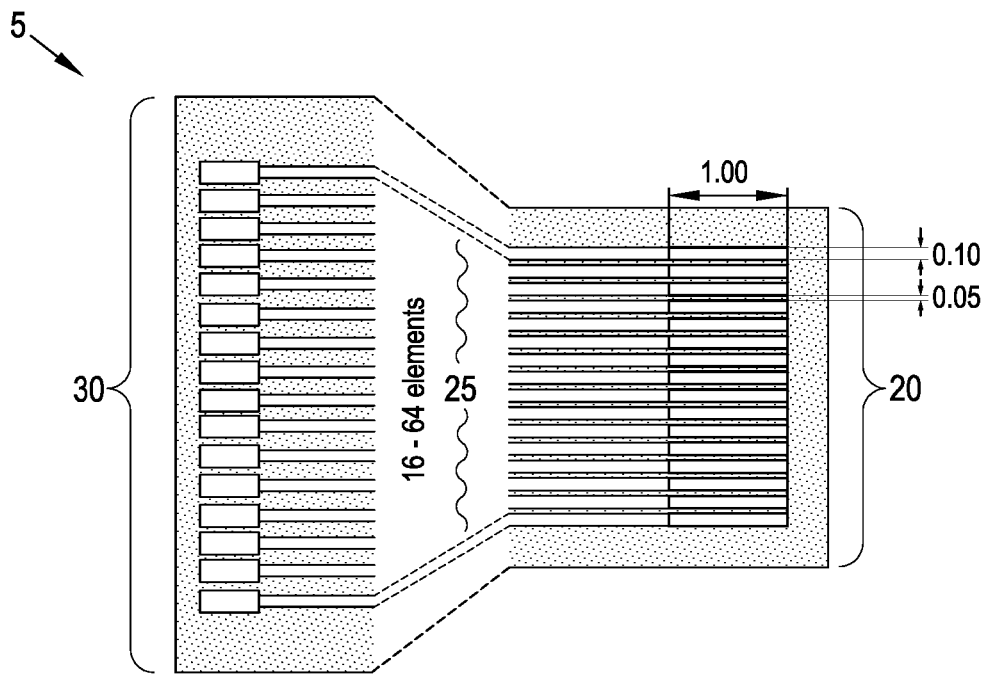
FIG. 1 is a schematic planar view of an ultrasonic transducer array.
Figure 2:
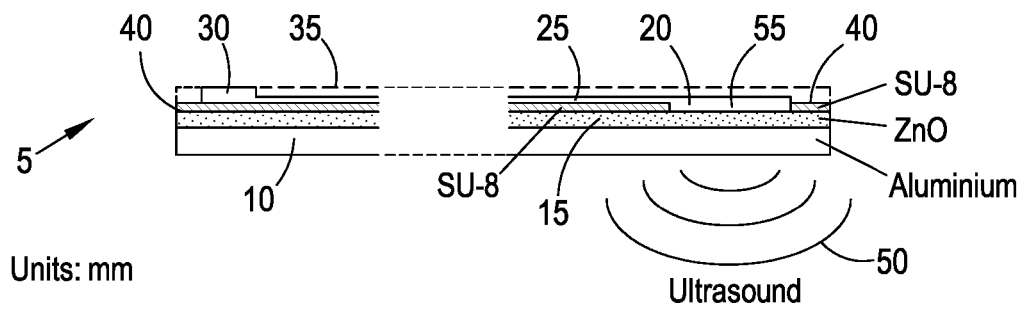
FIG. 2 is schematic side view of the transducer array of FIG. 1.

FIG. 1 shows a schematic planar view of an ultrasonic transducer array 5 and FIG. 2 shows a schematic side view of the ultrasonic transducer array 5. The ultrasonic transducer array 5 comprises an electrically conductive substrate 10 in the form of a metal foil, in this case an aluminium foil, and a layer of crystalline piezoelectric material 15 disposed on one planar surface of the substrate 10. The substrate 10 acts to support the layer of piezoelectric material 15 and also functions as a counter electrode and ultrasonic wave radiation surface from which ultrasonic waves are emitted from the transducer array in use. The substrate 10 is much thicker (i.e. in the order of magnitude of 10 times thicker) than the layer of piezoelectric material 15 and in this example, the substrate 10 is between 20 and 200 μm thick and the layer of piezoelectric material 15 is between 2 and 20 μm thick. In this example, the piezoelectric material is ZnO but it will be appreciated that other suitable piezoelectric materials such as AlN may be used.

An array of metallic (in this case gold) elongate working electrodes 20 are provided on a surface of the layer of piezoelectric material 15 that is on an opposite side of the layer of piezoelectric material 15 to the substrate 10. The working electrodes 20 are linearly distributed in the example shown but may be distributed in two dimensions in other embodiments. Each of the working electrodes 20 is connected to a corresponding electrically conductive track 25. The tracks 25 from each of the working electrodes fan out and become increasingly distant from each other as they extend away from the working electrodes 20. An end of the respective tracks 15 that is distal to the associated working electrode 20 is electrically connected to an associated electrical connector 30. In this way, each working electrode 20 in the array is individually operable/addressable by electrically driving/addressing the corresponding connector 30. Since the conductive tracks 25 fan out between the working electrodes 20 and the connectors 30, a high resolution ultrasonic transducer array may be provided by the closely spaced working electrodes 20 but at the same time, the connectors 30 are spaced for easy connection, e.g. by matching a standard connector configuration.

In examples, between 16 and 128 working electrodes 20 are provided in the array, where each electrode is 1 mm long by 0.1 mm wide with a gap of 0.05 mm between electrodes 20. In contrast, the connectors 30 have a pitch of 0.5 mm. Cured electrically insulating cross linked resist material such as SU-8 epoxy is provided between the working electrodes 20, between the tracks 25 and between the connectors 30, which may help to prevent electrical cross talk.

An electrically insulating dielectric encapsulating material 35 is provided over and around the electrodes 20 and the conductive tracks 25. However, the connectors 30 are left exposed to allow electrical connections to a controller or processing device to be made. The radiating surface of the substrate 10 (i.e. the surface of the substrate opposite to the piezoelectric material 15) is also left exposed and clear of encapsulation material.

In order to generate the ultrasound, the alternating electrical driving current is applied to the appropriate connector 30 or connectors 30 and thereby via the conductive tracks 25 to the corresponding working electrode 20 or electrodes 20. The working electrodes 20 form a couple with the conductive substrate that acts as a counter or ground electrode in order to apply an alternating electrical current across the corresponding sections of the piezoelectric material 15. This in turn causes the corresponding sections of piezoelectric material to vibrate at high frequency along with the corresponding portion of the substrate to thereby generate ultrasonic waves, which are emitted from portions of the outer surface of the substrate that correspond to the driven working electrode(s) 20.

Figure 3:
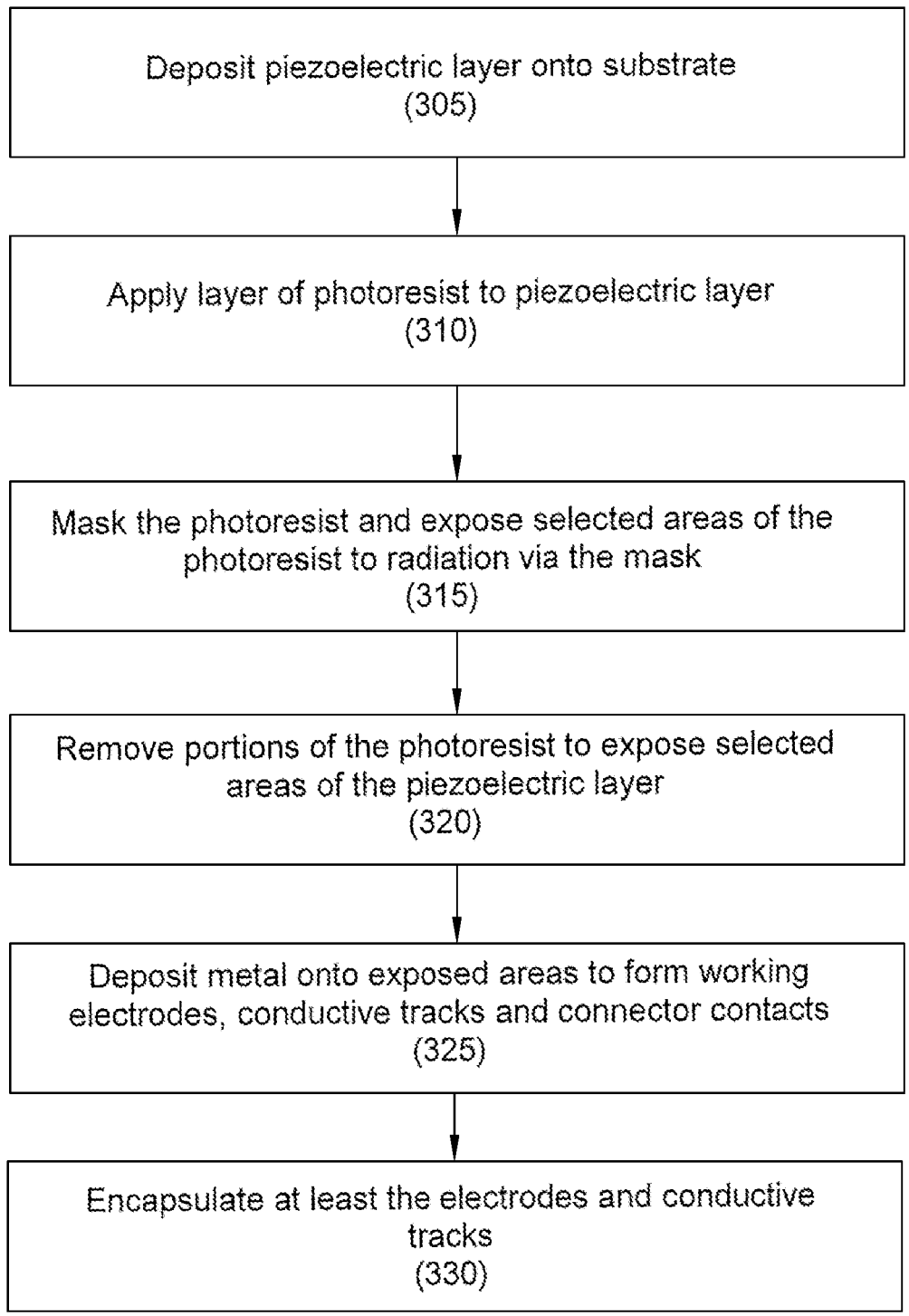
FIG. 3 is a flowchart showing a method of producing the transducer array of FIGS. 1 and 2.

The ultrasonic transducer 5 of FIGS. 1 and 2 can be conveniently and beneficially produced using additive manufacturing. One possible example of a suitable additive manufacturing process for producing the ultrasonic transducer 5 is shown in FIGS. 3 to 10. FIG. 3 shows a flowchart of the additive manufacturing process. FIGS. 4A, 5A, 6A, 7A, 8A, 9A and 10A show side cross sectional views of what will become the ultrasonic transducer array 5 during various stages of the additive manufacturing process. FIGS. 4B, 5B, 6B, 7B, 8B, 9B and 10B show corresponding plan views of what will become the ultrasonic transducer array 5 during various stages of the additive manufacturing process.

Figure 4A:
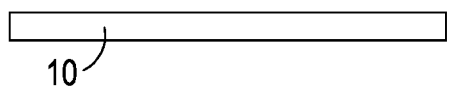
FIGS. 4 to 10 are schematic illustrations of steps of the method of FIG. 3, where the Figures suffixed with A are side cross sectional views and the Figures suffixed with B are plan views of the object that will become the ultrasonic transducer array of FIGS. 1 and 2 during stages of manufacture.
Figure 4B:
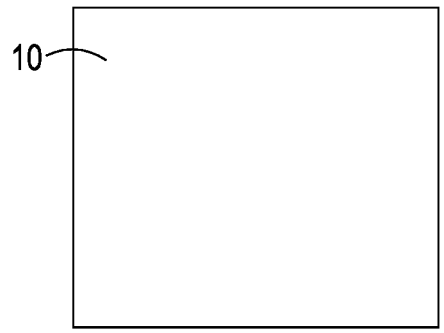
Figure 5A:
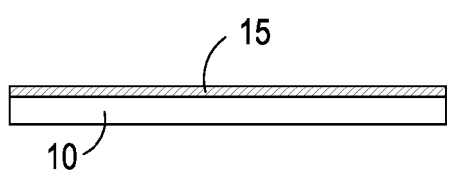
Figure 5B:
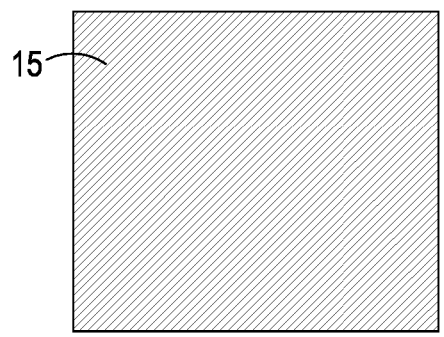

As shown in FIGS. 4A and 4B, the process starts with the substrate 10 in the form of a metal foil, such as aluminium foil. The substrate can be from 20 to 200 μm thick. As indicated in step 305 of FIG. 3 and shown in FIGS. 5A and 5B, the substrate 10 is coated on one side with a thin layer of polycrystalline piezoelectric material 15, such as zinc oxide (ZnO) or aluminium nitride (AlN). The layer of piezoelectric material 15 is of the order of a $10^{th}$ of the thickness of the substrate 10, e.g. from 2 to 20 μm thick. The layer of piezoelectric material 15 can be deposited by a range of suitable techniques such as sputter coating, chemical vapour deposition and/or the like. For example, the piezoelectric material 15 could be deposited using closed field magnetron sputtering or high power impulse magnetron sputtering, which may optimize the piezoelectric properties of the film and/or the growth morphology.

Figure 6A:
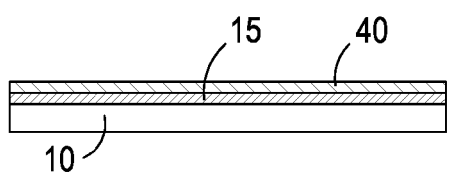
Figure 6B:
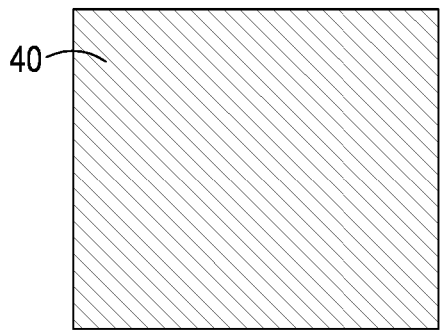
Figure 7A:
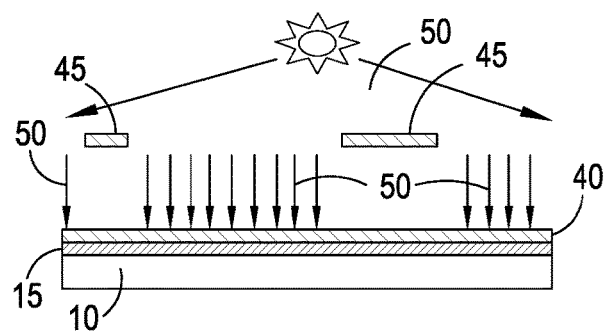
Figure 7B:
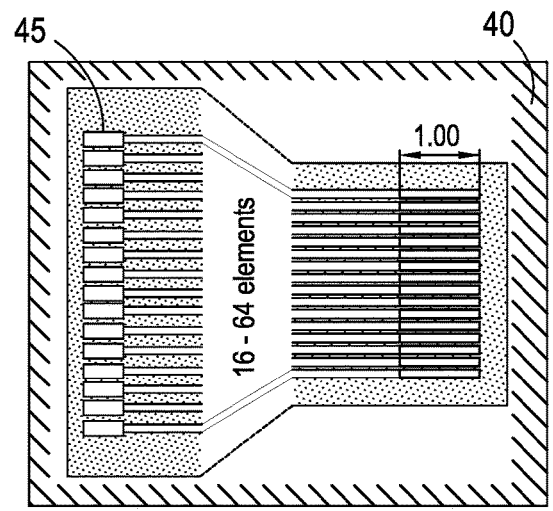

As indicated in step 310 of FIG. 3 and as shown in FIGS. 6A and 6B a surface of the layer of piezoelectric material 15 that is opposite the substrate 10 is then covered by a layer of photoresist 40 such as SU-8. Then, as indicated in step 315 of FIG. 3 and as shown in FIGS. 7A and 7B, the photoresist 40 is exposed to radiation via a patterned mask 45.

Openings in the mask 45 serve to let radiation 50 through and solid portions of the mask 45 serve to block portions of the radiation 50. The radiation 50 is such that it changes the state of the parts of the photoresist 40 that are exposed to radiation 50. For example, in a negative photoresist 40 the radiation 50 crosslinks the photoresist 40 such that is becomes insoluble whereas the portions of the photoresist that haven't been exposed to the radiation remain soluble in a suitable solvent. Alternatively, a positive photoresist could be used. The patterning and shape of the mask 45 imparts the image of the electrodes 20, the conductive tracks 25 and the contacts 30 in the photoresist 40 by masking the radiation 50.

Figure 8A:
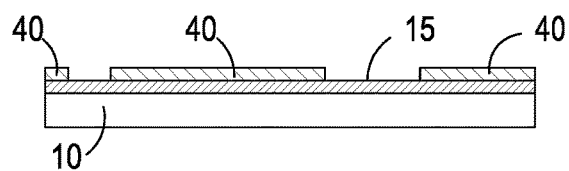
Figure 8B:
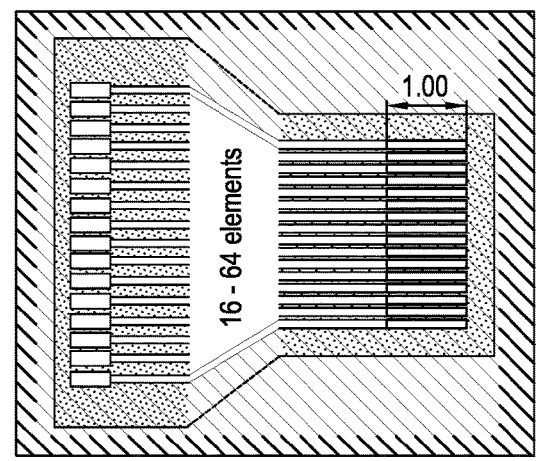

As indicated in step 320 of FIG. 3 and as shown in FIGS. 8A and 8B, the suitable solvent is applied to the photoresist 40 in order to remove the sections of the photoresist 40 corresponding to the electrodes 20, the conductive tracks 25 and the contacts 30 as imaged in the photoresist 40 by the radiation 50 using the mask 45. Removal of the photoresist 40 exposes corresponding portions of the layer of piezoelectric material 15.

Figure 9A:
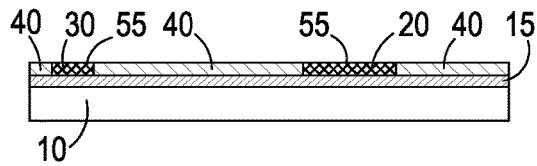
Figure 9B:
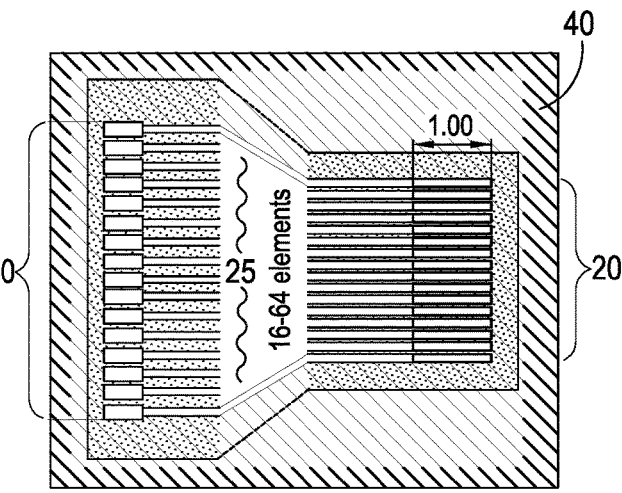

As indicated in step 325 of FIG. 3 and as shown in FIGS. 9A and 9B, a layer of metal 55 is deposited such that it is deposited onto the exposed portions of the piezoelectric material 15. In this way, the metal 55 on the exposed portions of the piezoelectric material 15 form the array of working electrodes 20, the conductive tracks 25 and the contacts 30.

Figure 10A:
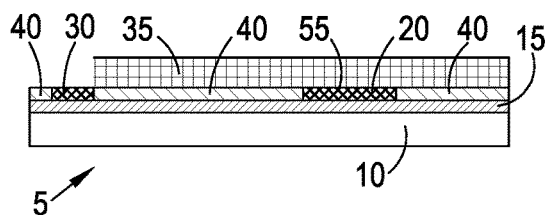
Figure 10B:
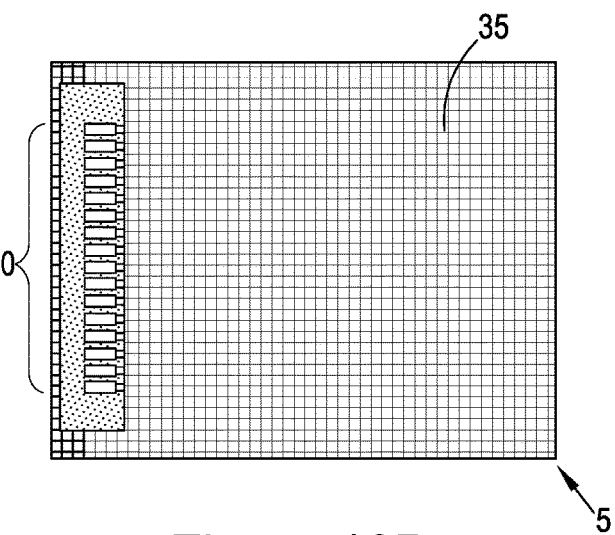

The electrically insulating cured photoresist 40 remains between each of the electrodes 20 of the electrode array, between the conductive tracks 25 and between the contacts 25 and acts to help prevent crosstalk. In addition, as indicated in step 330 of FIG. 3 and as shown in FIGS. 10A and 10B, the electrically insulating encapsulating material 35 is provided over and around the outer surface of the electrodes 20 and the conductive tracks 25 in order to protect and insulate them. The encapsulating material 35 can be any suitable dielectric material. However, the contacts 30 are left exposed so that they can form an electrical connection to a suitable controller, signal generator and/or processing device.

Figure 11:
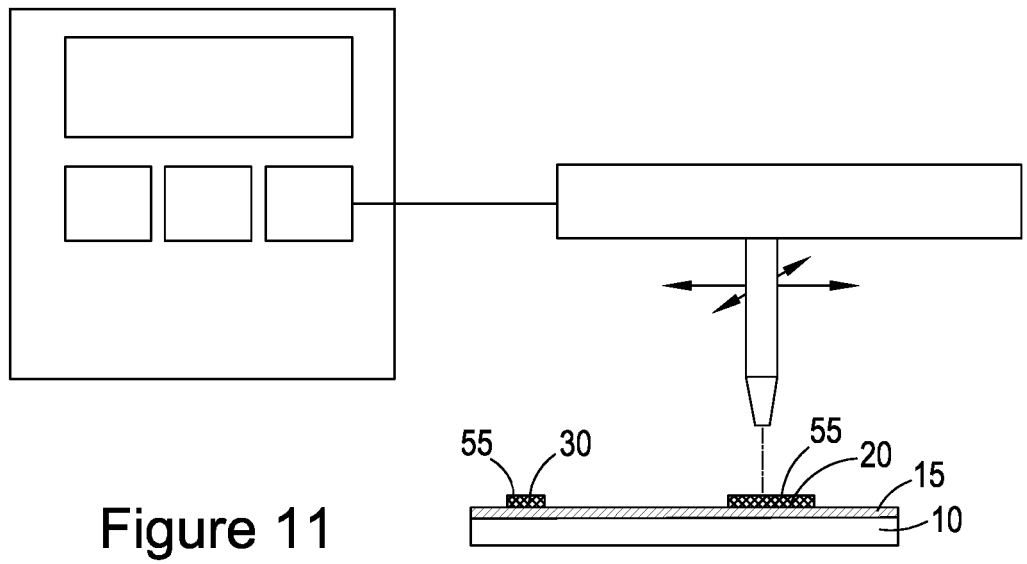
FIG. 11 is a schematic of an additive manufacturing system.

Although a beneficial example of an additive manufacturing method to form the ultrasonic transducer array is shown in, and described in relation to, FIGS. 3 to 10, it will be appreciated that other suitable additive manufacturing techniques could be used. For example, the masking, photo-patterning, selective removal of photoresist and metal deposition of steps 310 to 325 may be replaced by directly 3D printing or otherwise applying the metal 55 in the appropriate pattern to form the electrodes 20, the conductive tracks 25 and/or the contacts 30, using a 3D printer or other additive manufacturing apparatus 1205, as shown in FIG. 11. Other suitable additive manufacturing techniques could be apparent to a skilled person.

Although specific examples are described above in relation to the Figures, it will be appreciated that variations on the above examples are possible. As such, the scope of protection is defined by the claims and not by the above specific examples.

Figure 12:
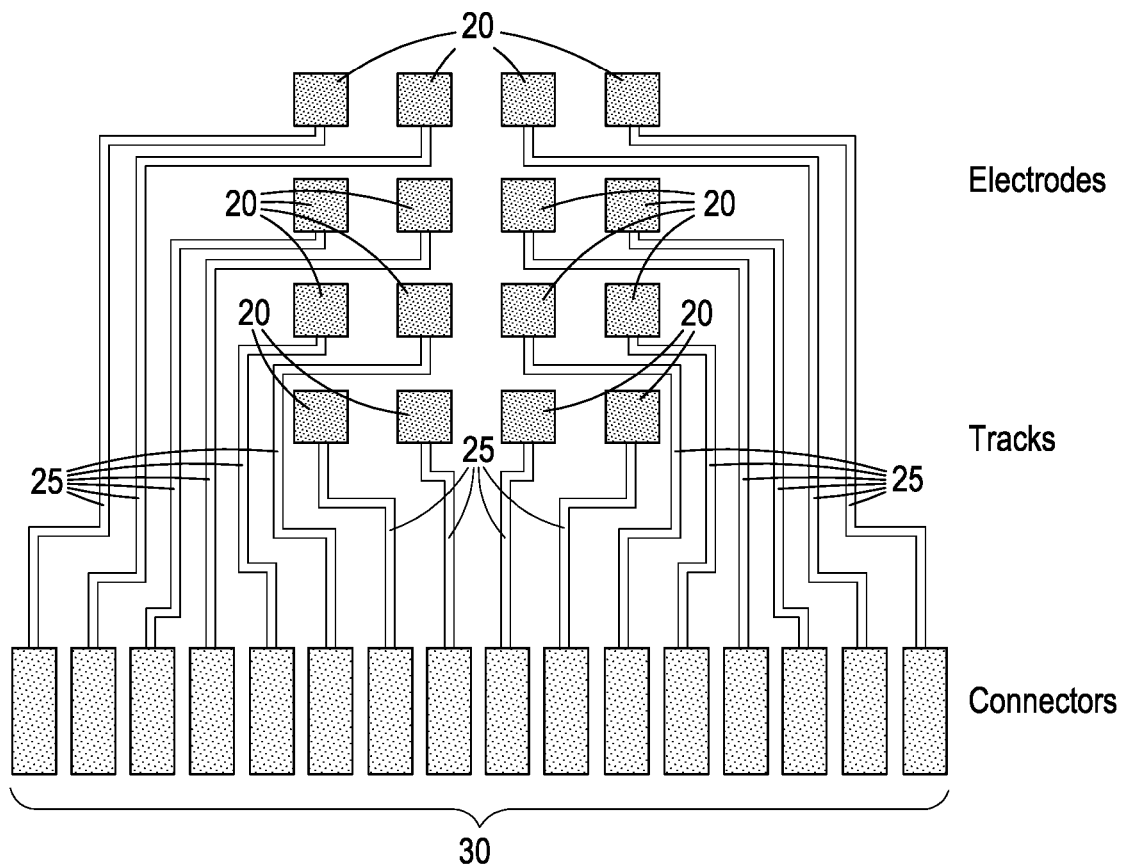
FIG. 12 is an alternative ultrasound transducer array that can be produced using the method of FIG. 3.
Figure 13:
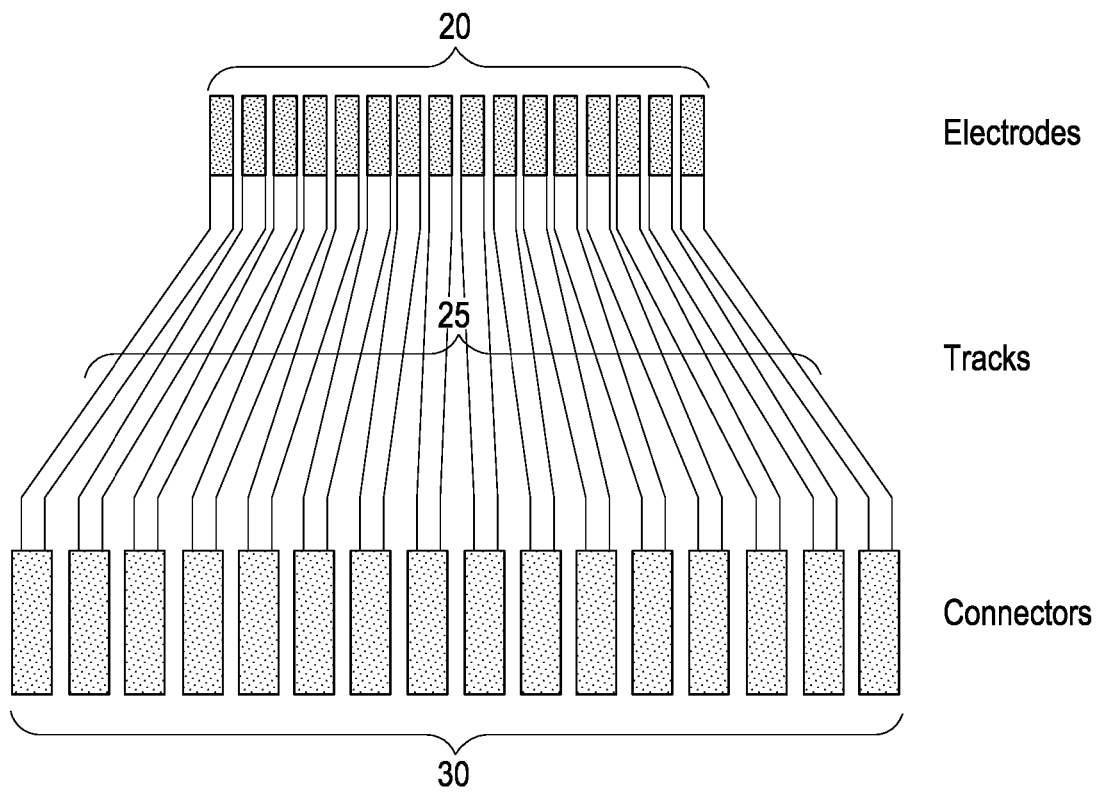
FIG. 13 is another alternative ultrasound transducer array that can be produced using the method of FIG. 3.
Figure 14:
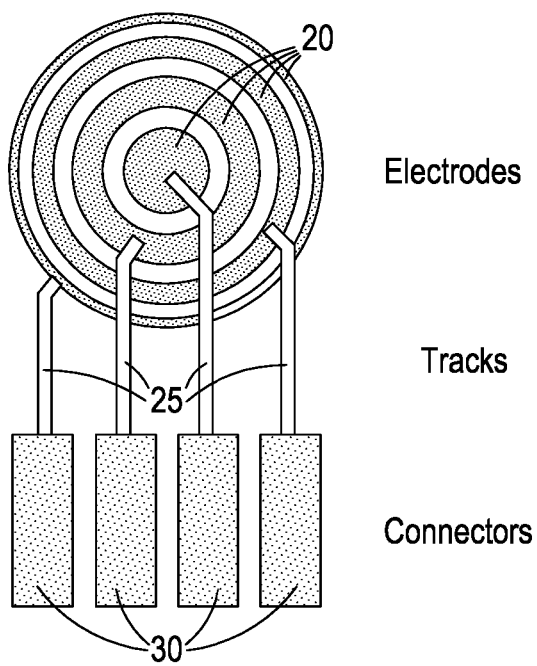
FIG. 14 is another alternative ultrasound transducer array that can be produced using the method of FIG. 3.
Figure 15:
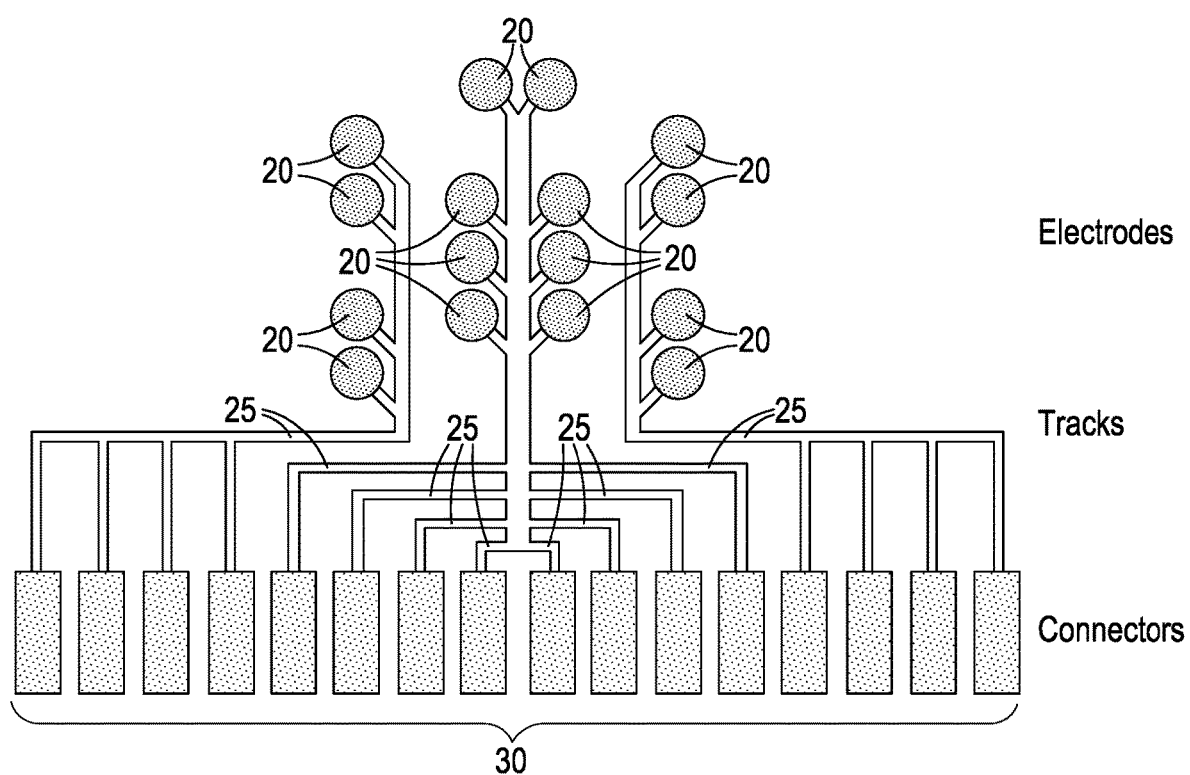
FIG. 15 is another alternative ultrasound transducer array that can be produced using the method of FIG. 3.

For example, although examples of piezoelectric materials being ZnO or AlN are given above, it will be appreciated that other piezoelectric materials could be used instead. In addition, although various thicknesses, dimensions, numbers and geometric arrangements of electrodes, conductive tracks and contacts are given above, it will be appreciated that other thicknesses, dimensions, numbers and geometric arrangements of electrodes, conductive tracks and contacts could be used. Indeed, although the electrodes are all shown as the same size and shape, it will be appreciated that at least some or all of the electrodes may be of different sizes and/or shapes. Furthermore, the electrodes in the electrode array need not be arranged linearly. Some examples of alternate electrode arrangements are shown in FIGS. 12 to 15. FIG. 12 shows an ultrasonic transducer array 5 that is similar to that shown in FIGS. 1 and 2 but with the electrodes 20 distributed in two dimensions rather than linearly. In the example of FIG. 12, the electrodes 20 are distributed in a grid arrangement and the electrodes are square but other two dimensional distributions of electrodes and/or other electrode shapes or sizes could be used. FIG. 13 shows an ultrasonic transducer array 5 that is similar to that shown in FIGS. 1 and 2 with the electrodes 20 arranged linearly and being rectangular. FIG. 14 shows an embodiment having annular electrodes 20 with a circular electrode 20 in the centre. In this example, the electrodes 20 are arranged concentrically but need not be. Similarly, the "nested"/concentric principle shown in FIG. 14 can be applied to other shapes and arrangements of electrodes. FIG. 15 shows an electrode arrangement in a tree format in this case having circular electrodes. However, the scope of coverage includes other arrangements of electrodes 20, connectors 25 and contacts 30, including but not limited to any suitable combinations of features of any of the embodiments shown and/or described herein, and/or other suitable configurations that would be apparent based on the present teaching. Employing the methods described herein make it easier of the designer of the ultrasonic transducer array 5 to provide arrangements, numbers, sizes and shapes of electrodes 20 to produce ultrasonic radiation best suited to the intended application.

The invention claimed is:

1. A method for manufacturing, or for use in manufacturing, a flexible ultrasonic transducer for imaging and non-destructive testing, the method comprising:
    providing a layer of piezoelectric material on a metallic foil substrate;
    using additive techniques to apply a plurality of electrodes to a surface of the piezoelectric material and to apply a plurality of electrical conduction tracks and a plurality of electrical connectors to a surface of a layer of dielectric material provided on the surface of the piezoelectric material, wherein the electrodes are arranged in an electrode array, and respective electrical conduction tracks of the plurality of electrical conduction tracks electrically connect a respective electrode of the plurality of electrodes to a respective electrical connector;
    wherein the additive techniques comprise at least one of: masking, deposition, photo patterning, printing or patterned coating, and the respective electrode is integrally formed with the respective electrical conduction track and the respective electrical connector using the additive techniques.

2. The method of claim 1 comprising:
    applying a resist material to the surface of the layer of piezoelectric material;
    providing a mask defining an open pattern reflecting or imaging a shape of electrodes, the conduction tracks and/or the connectors;
    applying radiation to the resist material via the mask so that only selected areas of the resist material receive the radiation, as governed by the open pattern of the mask such that the received radiation selectively crosslinks or otherwise modifies or reacts the selected areas of the resist material that receive the radiation;
    removing parts of the resist material according to whether or not they have received the radiation; and
    applying a conductive material at least to parts of the piezoelectric material that are not covered by resist material to form the plurality of electrodes of the electrode array.

3. The method of claim 1, wherein the electrodes of the electrode array are elongate.

4. The method of claim 1, wherein the electrodes of the electrode array are between 0.1 and 10 mm long and between 0.01 and 1 mm wide and spaced from each other by between 0.01 and 0.1 mm.

5. The method of claim 1, wherein at least part of one of the electrical conduction tracks extends away from, spreads or fans out from one other electrical conduction track.

6. The method of claim 5, wherein a separation between the electrical connectors is greater than a separation between the electrodes of the electrode array.

7. The method of claim 1, wherein the electrode array comprises from 8 to 256 electrodes.

8. The method of claim 1 comprising providing an encapsulating material on, around and/or between at least part or all of the electrical conduction tracks and/or the electrodes of the electrode array.

9. The method of claim 8, wherein the encapsulation material is an electrically insulating dielectric material.

* * * * *